(12) United States Patent
He et al.

(10) Patent No.: US 12,185,527 B2
(45) Date of Patent: Dec. 31, 2024

(54) SEMICONDUCTOR STRUCTURE COMPRISING A WORD LINE WITH CONVEX PORTIONS AND MANUFACTURING METHOD THEREOF

(71) Applicant: CHANGXIN MEMORY TECHNOLOGIES, INC., Hefei (CN)

(72) Inventors: Yachuan He, Hefei (CN); Hsin-Pin Huang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 634 days.

(21) Appl. No.: 17/445,317

(22) Filed: Aug. 18, 2021

(65) Prior Publication Data

US 2022/0045071 A1 Feb. 10, 2022

Related U.S. Application Data

(63) Continuation of application No. PCT/CN2021/093135, filed on May 11, 2021.

(30) Foreign Application Priority Data

Aug. 5, 2020 (CN) .......................... 202010777763.2

(51) Int. Cl.
 *H10B 12/00* (2023.01)
 *H01L 21/027* (2006.01)
(52) U.S. Cl.
 CPC ....... *H10B 12/488* (2023.02); *H01L 21/0273* (2013.01); *H10B 12/34* (2023.02)

(58) Field of Classification Search
 CPC .................................................. H10B 12/488
 See application file for complete search history.

(56) References Cited

U.S. PATENT DOCUMENTS

| | | | |
|---|---|---|---|
| 8,426,925 | B2 | 4/2013 | Chuang |
| 8,658,538 | B2 | 2/2014 | Chuang et al. |
| 9,859,284 | B2 | 1/2018 | Wang |
| 9,859,285 | B2 | 1/2018 | Wang |
| 10,050,041 | B1 | 8/2018 | Yoon |
| 10,199,379 | B2 | 2/2019 | Cho et al. |
| 10,847,518 | B2 | 11/2020 | Wang |
| 2012/0119277 | A1 | 5/2012 | Chuang |

(Continued)

FOREIGN PATENT DOCUMENTS

| | | |
|---|---|---|
| CN | 106992156 A | 7/2017 |
| CN | 109524399 A | 3/2019 |

(Continued)

OTHER PUBLICATIONS

Supplementary European Search Report in the European application No. 21852276.1, mailed on Jul. 27, 2023. 9 pages.

(Continued)

*Primary Examiner* — Eric A. Ward
(74) *Attorney, Agent, or Firm* — Syncoda LLC; Feng Ma

(57) ABSTRACT

A semiconductor structure includes a substrate, an isolation structure formed in the substrate, and a word line including a first convex portion and a second convex portion. The first convex portion and the second convex portion are located in the isolation structure, and a depth of the first convex portion is greater than a depth of the second convex portion.

17 Claims, 13 Drawing Sheets

(56) References Cited

U.S. PATENT DOCUMENTS

| | | | |
|---|---|---|---|
| 2013/0075812 A1* | 3/2013 | Ho | H01L 29/785 257/330 |
| 2013/0183809 A1 | 7/2013 | Chuang et al. | |
| 2016/0197084 A1 | 7/2016 | Yoon | |
| 2016/0284640 A1* | 9/2016 | Wang | H01L 27/0207 |
| 2017/0213834 A1 | 7/2017 | Wang | |
| 2017/0213837 A1 | 7/2017 | Wang | |
| 2018/0083011 A1 | 3/2018 | Wang | |
| 2018/0233506 A1 | 8/2018 | Yoon | |
| 2019/0296025 A1 | 9/2019 | Yoon | |
| 2020/0273863 A1* | 8/2020 | Zhu | H01L 29/0649 |

FOREIGN PATENT DOCUMENTS

| | | |
|---|---|---|
| CN | 110534480 A | 12/2019 |
| CN | 110896046 A | 3/2020 |
| CN | 111463205 A | 7/2020 |
| CN | 111463205 B | 7/2022 |
| JP | 2019036720 A | 3/2019 |

OTHER PUBLICATIONS

First Office Action of the Japanese application No. 2022-552276, issued on Sep. 26, 2023. 8 pages with English translation.
International Search Report in the international application No. PCT/CN2021/093135, mailed on Aug. 16, 2021. 6 pages with English translation.
Written Opinion of the International Search Authority in the international application No. PCT/CN2021/093135, mailed on Aug. 16, 2021. 6 pages with English translation.

* cited by examiner

SEMICONDUCTOR STRUCTURE COMPRISING A WORD LINE WITH CONVEX PORTIONS AND MANUFACTURING METHOD THEREOF

CROSS-REFERENCE TO RELATED APPLICATIONS

This is a continuation of International Application No. PCT/CN2021/093135 filed on May 11, 2021, which claims priority to Chinese Patent Application No. 202010777763.2 filed on Aug. 5, 2020. The disclosures of these applications are hereby incorporated by reference in their entirety.

BACKGROUND

With continuous decrease in the size of Dynamic Random-Access Memory (DRAM), the size of the transistor in the storage region is also decreased, thereby bringing serious leakage current problems and affecting device performances.

SUMMARY

The disclosure relates generally to the technical field of semiconductors, and more specifically to a semiconductor structure and a method for manufacturing a semiconductor structure.

The disclosure provides a semiconductor structure and a method for manufacturing a semiconductor structure to improve performances of the semiconductor structure.

According to a first aspect of the disclosure, a semiconductor structure is provided. The semiconductor structure includes: a substrate, an isolation structure formed in the substrate, and a word line. The word line includes a first convex portion and a second convex portion. The first convex portion and the second convex portion are located in the isolation structure, and a depth of the first convex portion is greater than a depth of the second convex portion.

According to a second aspect of the disclosure, a method for manufacturing a semiconductor structure is provided. The method includes the following operations.

A substrate having an isolation structure and a plurality of active regions is provided. The isolation structure is disposed among the plurality of active regions.

A first groove and a second groove are formed at intervals on the isolation structure, and a depth of the first groove is greater than a depth of the second groove.

A word line is formed in the substrate, and the word line includes a main body portion, a first convex portion and a second convex portion. The first convex portion and the second convex portion are respectively disposed in the first groove and the second groove.

BRIEF DESCRIPTION OF THE DRAWINGS

Various objectives, features, and advantages of the disclosure will become clearer by considering the following detailed descriptions of the preferred implementation modes of the disclosure in conjunction with the accompanying drawings. It is apparent that the accompanying drawings are merely exemplary illustrations of the disclosure, and may be not drawn to scale. The same reference numerals always refer to the same or similar components in the drawings.

LIST OF REFERENCE NUMERALS

Figure 1:
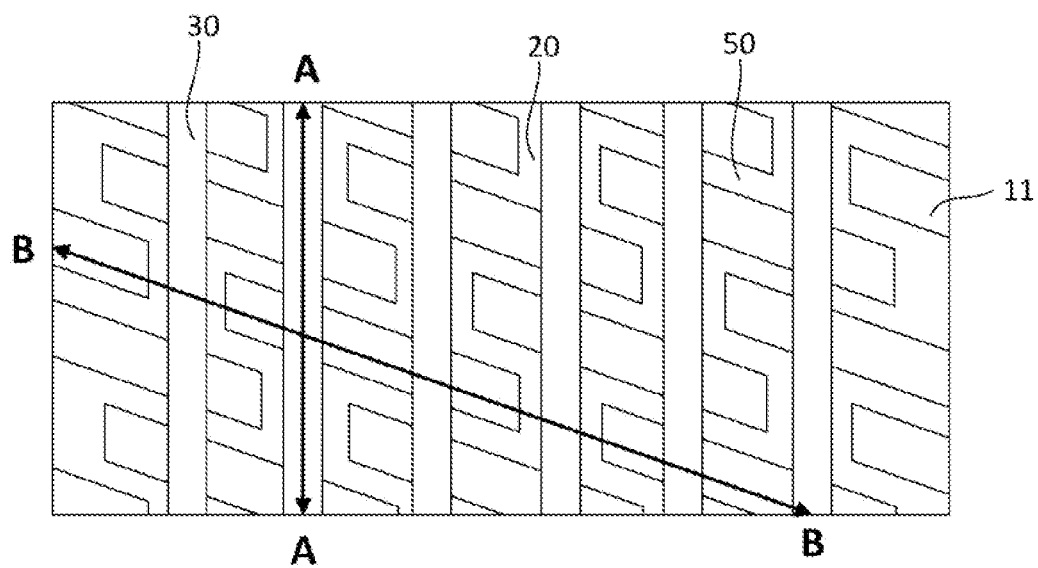
FIG. 1 schematically illustrates a structure of a semiconductor structure according to some embodiments.
Figure 2:
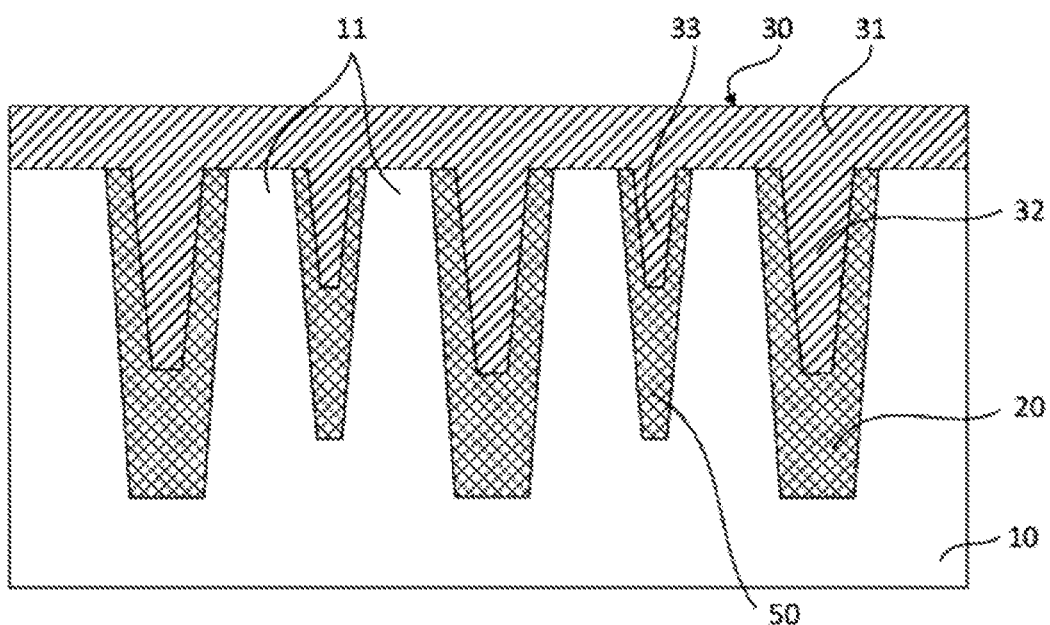
FIG. 2 schematically illustrates a structure along A-A section of FIG. 1.
Figure 3:
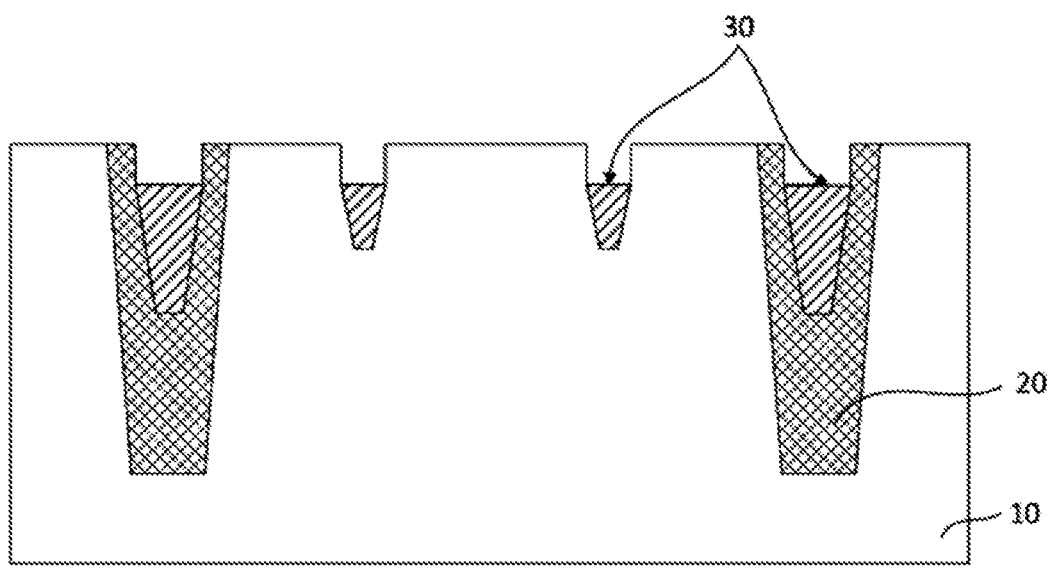
FIG. 3 schematically illustrates a structure along B-B section of FIG. 1.

10: substrate; 11: active region; 20: first isolation structure; 30: word line; 3: main body portion; 32: first convex portion; 33: second convex portion; 321: lower convex portion; 322: upper convex portion; 40: first photoresist layer; 41: groove; 43: photoresist opening; 44: word line mask layer; 231: a first groove; 232: second groove; 45: word line mask opening; 50: second isolation structure

DETAILED DESCRIPTION

Typical examples will be further described in detail to reflect the features and advantages of the disclosure. It should be understood that various changes may be made to examples of the disclosure, without departing from the scope of the disclosure. In addition, the descriptions and the accompanying drawings are intended for illustrating the present disclosure, rather than limiting it.

In the following descriptions will be described with reference to accompanying drawings. The accompanying drawings belong to a part of the disclosure, and schematically illustrate various structures, systems, and operations that may implement various aspects of the disclosure are shown by way of example. It should be understood that other specific solutions of components, structures, exemplary devices, systems, and steps may be used, and structural and functional modifications may be made without departing from the scope of the disclosure. Moreover, although the terms "above", "between", "within", etc. may be used in the description to describe different exemplary features and elements of the disclosure, these terms are used herein for convenience only, for example, for indicating the direction of an example in the figures. Any content in the description should not be understood as requiring a specific three-dimensional direction of the structure to fall within the scope of the disclosure.

An example of the disclosure provides a semiconductor structure. Referring to FIG. 1 to FIG. 6, the semiconductor structure includes: a substrate 10, an isolation structure formed in the substrate 10, and a word line 30. The word line 30 includes a first convex portion 32 and a second convex portion 33. The first convex portion 32 and the second convex portion 33 are located in the isolation structure, and a depth of the first convex portion 32 is greater than a depth of the second convex portion 33.

The semiconductor structure according to an example of the disclosure may enhance the control ability of the word line 30 to the transistor channel by making the first convex portion 32 of the word line 30 have a deeper depth than that of the second convex portion 33, thereby improving the leakage current. Specifically, the depth of the first convex portion 32 may be understood as a vertical distance from the bottom of the first convex portion 32 to a main body portion 31 of the word line 30. Similarly, the depth of the second convex portion 33 may be understood as a vertical distance from the bottom of the second convex portion 33 to the main body portion 31 of the word line 30.

In an example, the word line 30 further includes the main body portion 31, and the main body portion 31 is connected with the first convex portion 32 and the second convex portion 33.

In an example, a plurality of first convex portions 32 and a plurality of second convex portions 33 are provided, and the plurality of first convex portions 32 and the plurality of second convex portions 33 are disposed at intervals. Specifically, a plurality of first convex portions 32 and a plurality of second convex portions 33 are arranged below the same word line 30 at intervals in the isolation structure.

In an example, the isolation structure includes a first isolation structure 20 and a second isolation structure 50. The first convex portion 32 is located in the first isolation structure 20, the second convex portion 33 is located in the second isolation structure 50, and a bottom of the first isolation structure 20 is lower than a bottom of the second isolation structure 50.

In an example, as shown in FIG. 1, a plurality of active regions 11 are provided in the substrate 10. The isolation structure is provided among the plurality of active regions 11. The main body portion 31 is intersected with the active regions 11.

Specifically, the active regions 11 are formed in the substrate 10, and the isolation structures are filled among adjacent active regions 11. The depth of each of the isolation structures may be the same or different. Combined with FIG. 1, it can be seen that the word line 30 spans the plurality of active regions 11. That is, the main body portion 31 is intersected with the active regions 11.

In an example, the plurality of active regions 11 are arranged in a plurality of rows. The first isolation structure 20 is located between ends of two adjacent active regions 11, and the second isolation structure 50 is located between sides of two adjacent active regions 11.

Specifically, combined with FIG. 1, the plurality of active regions 11 are arranged in the plurality of rows, and these rows are arranged in parallel. The word line 30 spans the plurality of rows of active regions 11. The sides of two adjacent active regions 11 in two adjacent rows have relative short distance therebetween, while the ends of the two adjacent active regions 11 in one row have relative long distance therebetween.

In an example, a ratio between the depth of the first convex portion 32 and the depth of the second convex portion 33 is greater than 1.05. It should be noted that in the related techniques, the depth of each of the convex portions of the word line is the same in the ideal state. That is, when the grooves configured to accommodate the convex portions are etched, the depth of each groove should also be the same. However, in the etching practices, there will basically be a slight fluctuation (in terms of the fluctuation value, it can still be considered that the depth of each groove is equal) in the depth of each groove due to the limitation of the etching process. Therefore, each convex portion will also have a corresponding fluctuation. However, in this example, the ratio of the depth between the first convex portion 32 and the second convex portion 33 is greater than 1.05, which is different from the height difference caused by fluctuations in the related techniques, and is a semiconductor structure with miniaturization and high performance obtained by process control in the manufacturing process. In other example, the ratio of the depth between the first convex portion 32 and the second convex portion 33 may be greater than 1.1, 1.2, 1.3, 1.4, 1.5 or 1.6.

In an example, the substrate 10 may be a p-type silicon substrate, an n-type silicon substrate, a silicon germanium substrate, etc.

In an example, the depth of the first convex portion 32 is greater than 30 nm. In the specific molding process, through the determination of the ratio of the depth between the first convex portion 32 and the second convex portion 33, the depth of the second convex portion 33 is determined according to the depth of the first convex portion 32.

In an example, the depth of the second convex portion 33 is less than 25 nm. In the specific molding process, through the determination of the ratio of the depth between the first convex portion 32 and the second convex portion 33, the depth of the first convex portion 32 is determined according to the depth of the second convex portion 33.

In an example, a length of the first convex portion 32 on the word line 30 along a direction perpendicular to an extension direction of the word line 30 is greater than a length of the second convex portion 33 along the direction perpendicular to the extension direction of the word line 30.

Specifically, the length of the first convex portion 32 on the same word line 30 along the direction perpendicular to the extension direction of the word line 30 may be understood as that the surface of the first convex portion 32 connected to the main body portion 31 has a first size along the extension direction of the main body portion 31 and has a second size along a direction perpendicular to the extension direction of the main body portion 31. Correspondingly, the second convex portion 33 also has a third size along the extension direction of the main body portion 31 and has a fourth size along the direction perpendicular to the extension direction of the main body portion 31. In addition, the second size is greater than the fourth size.

In an example, the first convex portion 32 includes: a lower convex portion 321, and an upper convex portion 322. A side wall of the lower convex portion 321 has a first slope, and a side wall of the upper convex portion 322 has a second slope. The first slope is different from the second slope.

Figure 4:
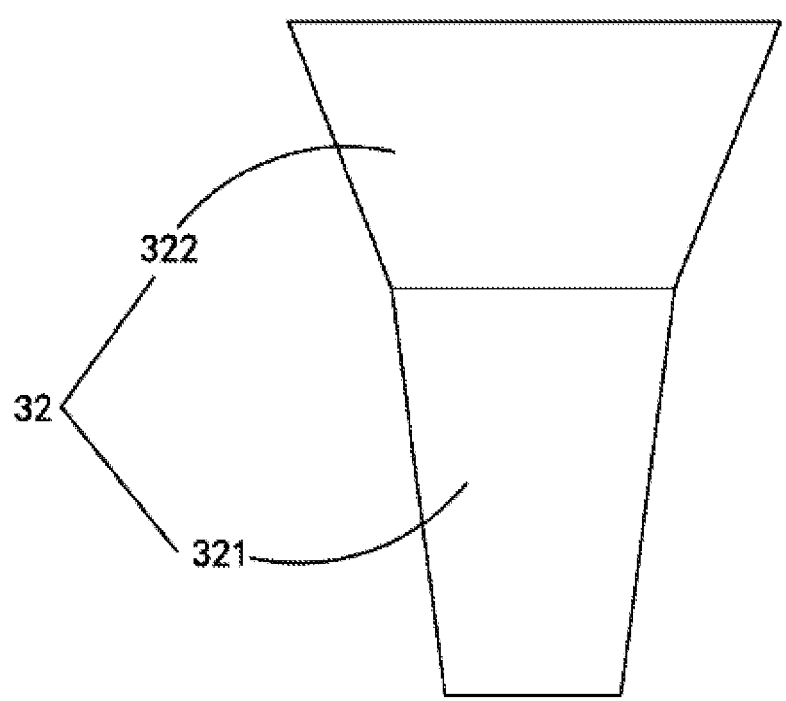
FIG. 4 schematically illustrates a structure of a first convex portion of a semiconductor structure according to some embodiments.
Figure 5:
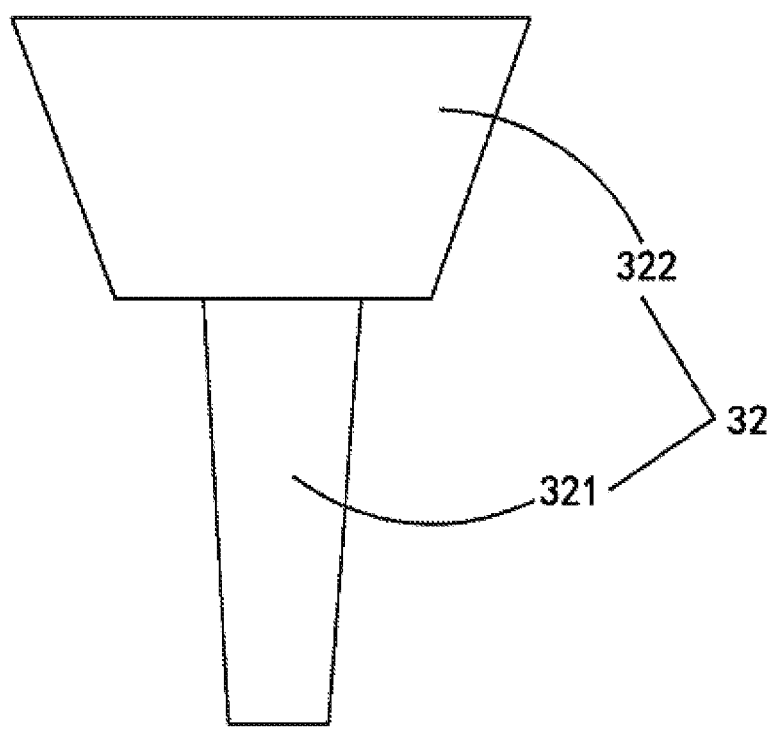
FIG. 5 schematically illustrates a structure of a first convex portion of a semiconductor structure according to another exemplary example.

Combined with FIG. 4 and FIG. 5, for example, the side wall of the upper convex portion 322 and the side wall of the lower convex portion 321 may be the side walls of the upper convex portion 322 and the lower convex portion 321 along A-A section. The first convex portion 32 consists of the lower convex portion 321 and the upper convex portion 322. The top end of the upper convex portion 322 is connected with the main body portion 31. The first slope is different from the second slope. That is, the inclination of the side wall of the lower convex portion 321 relative to the vertical direction is different from the inclination of the side wall of the upper convex portion 322 relative to the vertical direction. The side wall of the lower convex portion 321 and the side wall of the upper convex portion 322 are neither parallel nor on the same plane.

In an example, the first slope is greater than the second slope. That is, an included angle between the side wall of the lower convex portion 321 and a vertical direction is smaller than an included angle between the side wall of the upper convex portion 322 and the vertical direction. When the included angle between the side wall of the lower convex portion 321 and the vertical direction is smaller than the included angle between the side wall of the upper convex portion 322 and the vertical direction, the difficulty of the process may be reduced and the process window may be increased. Specifically, the included angle between the side wall of the upper convex portion 322 and the vertical direction is relatively large, which facilitates the formation of the first convex portion of the word line.

Figure 6:
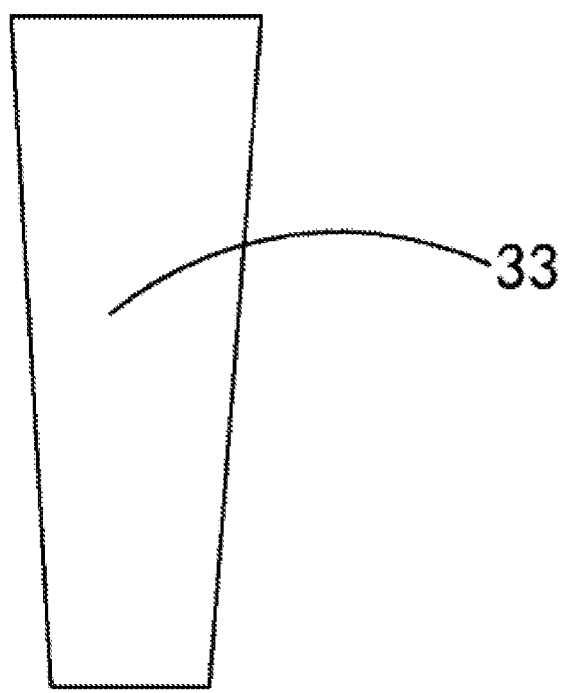
FIG. 6 schematically illustrates a structure of a second convex portion of a semiconductor structure according to some embodiments.
Figure 7:
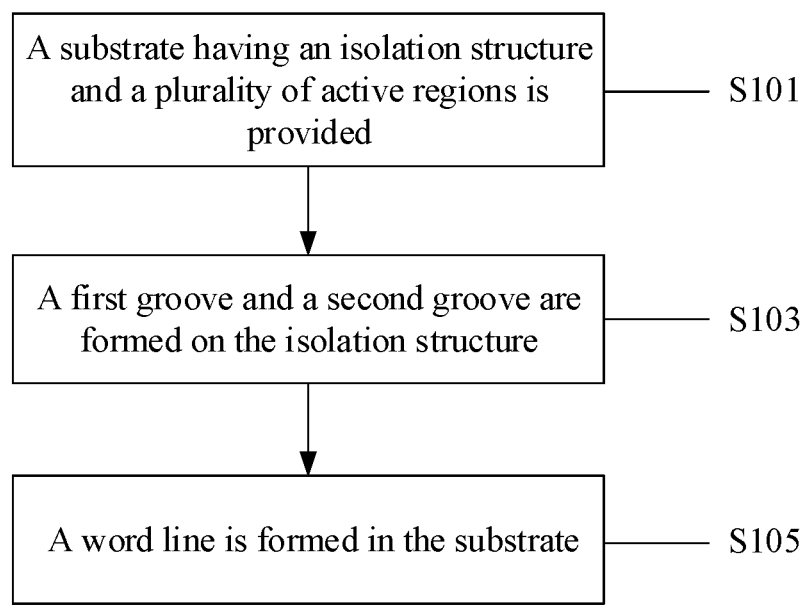
FIG. 7 illustrates a flowchart of a method for manufacturing a semiconductor structure according to some embodiments.

In an example, as shown in FIG. 4 to FIG. 6, the side wall of the second convex portion 33 has a third slope. The first slope is the same as the third slope. That is, the included angle between the side wall of the lower convex portion 321 and the vertical direction is the same as the included angle between the side wall of the second convex portion 33 and the vertical direction. Specifically, the grooves at the positions where the lower convex portion 321 and the second convex portion 33 are located can be formed simultaneously by using one-step etching process, so that the slopes of the side walls of the lower convex portion 321 and the second convex portion 33 formed by filling the grooves are the same, which can simplify the formation operations.

In an example, a size of a bottom of the upper convex portion 322 is larger than or equal to a size of a top of the lower convex portion 321.

As shown in FIG. 4, the size of the top of the upper convex portion 322 is larger than the size of the bottom of the upper convex portion 322. The size of the top of the lower convex portion 321 is larger than the size of the bottom of the lower convex portion 321. The size of the top of the lower convex portion 321 is the same as the size of the bottom of the upper convex portion 322. That is, portions for connecting the upper convex portion 322 with the lower convex portion 321 are completely coincided.

As shown in FIG. 5, the size of the top of the upper convex portion 322 is larger than the size of the bottom of the upper convex portion 322. The size of the top of the lower convex portion 321 is larger than the size of the bottom of the lower convex portion 321. The size of the top of the lower convex portion 321 is smaller than the size of the bottom of the upper convex portion 322. That is, portions for connecting the upper convex portion 322 and the lower convex portion 321 are not completely coincided. In this way, the process window can be increased, and the risk of direct contact between the lower convex portion 321 and the active regions can be reduced.

In an example, as shown in FIG. 6, the size of the top of the second convex portion 33 is larger than the size of the bottom of the second convex portion 33, so that the side wall of the second convex portion 33 has a third slope.

In an example, the upper convex portion 322 has a section of a circular shape or an elliptical shape along a direction of a surface of the substrate, while the lower convex portion 321 has a section of a strip shape along the direction of the surface of the substrate. The specific shapes of the upper convex portion 322 and the lower convex portion 321 may be controlled by the first groove 231 and the second groove 232, which is not limited herein, and may be selected according to actual needs.

In an example, the strip shape includes two parallel line segments and two arc line segments connecting ends of the two parallel line segments. The section of the lower convex portion 321 is composed of two parallel line segments and two opposite arc line segments. Specifically, the line segments are parallel to the extension direction of the word line 30. The line segment edge of the lower convex portion 321 may reduce the risk of direct contact with adjacent active regions, and at the same time, the arc line segment edge may reduce the difficulty of forming the lower convex portion. Specifically, the arc line segment edge is conducive to the filling of the conductor material.

An example of the disclosure further provides a method for manufacturing a semiconductor structure. As shown in FIG. 7 to FIG. 11, the method for manufacturing a semiconductor structure includes the following operations.

At S101, a substrate 10 having an isolation structure and a plurality of active regions 11 is provided. The isolation structure is disposed between the plurality of active regions 11.

At S103, a first groove 231 and a second groove 232 are formed at intervals on the isolation structure, and a depth of the first groove 231 is greater than a depth of the second groove 232.

At S105, a word line 30 is formed in the substrate 10, and the word line 30 includes a main body portion 31, a first convex portion 32, and a second convex portion 33. The first convex portion 32 and the second convex portion 33 are respectively disposed in the first groove 231 and the second groove 232.

The method for manufacturing a semiconductor structure according to an example of the disclosure may effectively improve the leakage current phenomenon of the semiconductor structure by forming the first groove 231 and the second groove 232 on the substrate 10 having the isolation structure and the plurality of active regions 11, and forming the word line 30 in the substrate 10, and making the first convex portion 32 of the word line 30 have a deeper depth.

Figure 8:
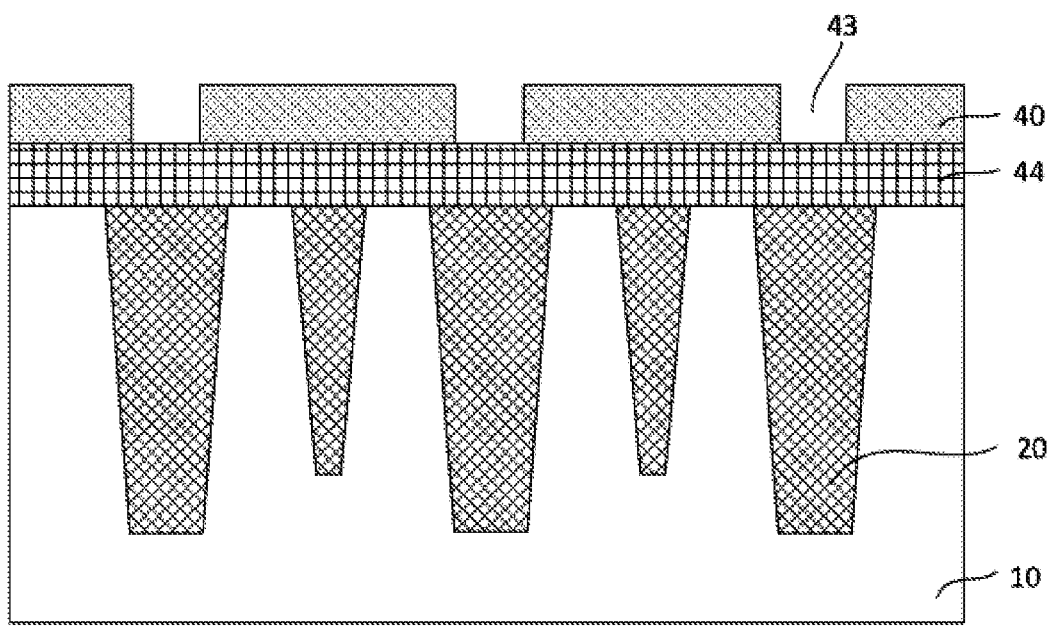
FIG. 8 schematically illustrates a structure of a semiconductor structure with a first photoresist layer formed by a method according to some embodiments.
Figure 9:
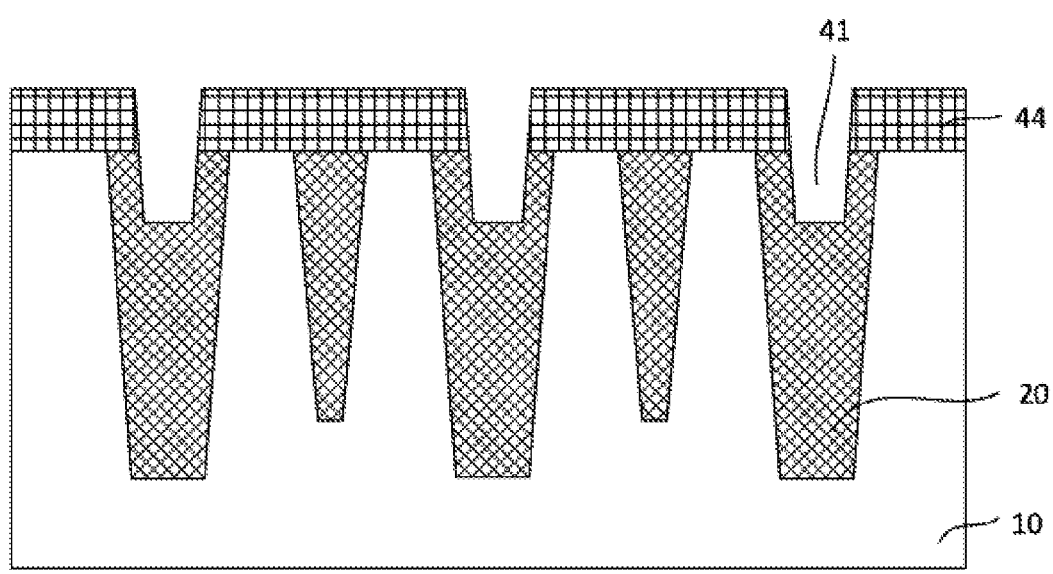
FIG. 9 schematically illustrates a structure of a semiconductor structure with a groove formed by a method according to some embodiments.

It should be noted that, as shown in FIG. 8, the substrate 10 provided is a substrate 10 having the isolation structure and the plurality of active regions 11. That is, without considering the specific molding process of the isolation structure and the plurality of active regions 11, the first groove 231 and the second groove 232 are directly formed on the substrate 10, and the word line 30 is formed. Before forming the first groove 231 and the second groove 232, the substrate 10 may be flattened by dry etching or Chemical Mechanical Polishing (CMP).

It should be noted that the word line 30 is an embedded word line, and the material of the word line 30 may be selected from one or a combination of tungsten, titanium, nickel, aluminum, platinum, titanium nitride, and other conductive materials. After the word line 30 is formed, the word line 30 may be flattened by dry etching or Chemical Mechanical Polishing (CMP).

In an example, the formation of the first groove 231 and the second groove 232 on the isolation structure includes the following operations. A groove 41 is formed on the isolation structure, and the groove 41 is located between the ends of two adjacent active regions 11. The first groove 231 and the second groove 232 are formed on the isolation structure with the groove 41, and the first groove 231 is formed at a position where the groove 41 is located. Specifically, the plurality of active regions 11 are arranged in parallel a plurality of rows, and the isolation structure is located between the plurality of active regions 11. The isolation structure includes a first isolation structure 20 and a second isolation structure 50. The first isolation structure 20 is located between the ends of two adjacent active regions 11, and the second isolation structure 50 is located between the sides of two adjacent active regions 11. Part of the first isolation structure 20 is etched to form a groove 41, and then the substrate 10 with the groove 41 is etched to form a first groove 231 and a second groove 232. The first groove 231 is etched downwards from the groove 41, so as to realize the control on the formation depths of the first groove 231 and the second groove 232, ensuring that the first groove 231 is formed with a deeper depth.

In an example, the formation of the groove 41 on the isolation structure includes the following operations. A first photoresist layer 40 with a photoresist opening 43 is formed on the substrate 10, and the photoresist opening 43 is located between the ends of two adjacent active regions 11. The isolation structure is etched by using the photoresist opening 43 to form the groove 41. Specifically, the photoresist opening 43 is located above the first isolation structure 20, and part of the first isolation structure 20 is etched to form the groove 41.

In an example, a word line mask layer 44 is formed on the substrate 10. The first photoresist layer 40 is located on the word line mask layer 44. The word line mask layer 44 is first etched by using the photoresist opening 43, and then the first isolation structure 20 is etched by using the etched word line mask layer 44 to form the groove 41.

In an example, the formation of the first groove 231 and a second groove 232 on an isolation structure with a groove 41 includes the following operations. A patterned second photoresist layer is formed on the substrate 10. An isolation structure is etched by using the patterned second photoresist layer to form the first groove 231 and the second groove 232 on the isolation structure.

In an example, a gate dielectric layer is formed in the first groove 231 and the second groove 232. Word lines 30 are formed by filling conductive material selected from one or a combination of tungsten, titanium, nickel, aluminum, platinum or titanium nitride into the first groove 231 and the second groove 232 of the substrate 10. The word line 30 may be formed by the chemical vapor deposition process, the physical vapor deposition process, or other deposition processes.

The gate dielectric layer may be selected from a film layer based on silicon material such as silicon oxide ($SiO_x$), silicon nitride ($Si_3N_x$), and silicon oxynitride (SiON), or a film layer based on high-K material such as Hafnium (Hf), zirconium (Zr), alumina ($AlO_x$) and the like. According to actual process requirements, at least one or a combination of the materials listed in this example may be selected, or other materials may be selected, which is not limited here.

For example, the gate dielectric layer may be obtained by Chemical Vapor Deposition (CVD) process. Alternatively, In Situ Steam Generation (ISSG) process may be first used to grow a thin layer of silicon dioxide, and then Atomic Layer Deposition (ALD) process may be used to grow a further thin layer of silicon dioxide, to form a gate dielectric layer.

Figure 10A:
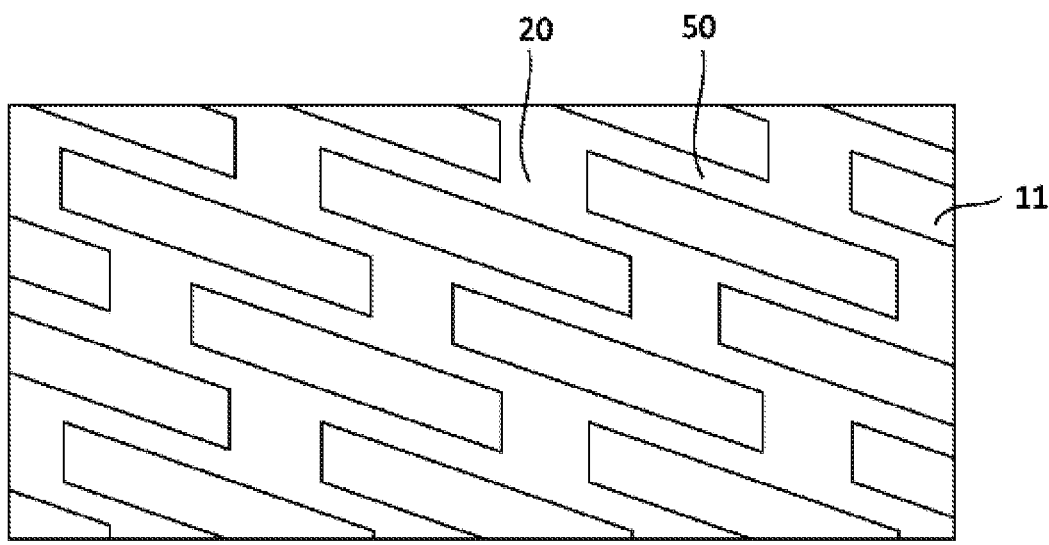
FIG. 10A is a first schematic diagram of a structure of a semiconductor structure during a manufacturing method according to some embodiments.
Figure 10B:
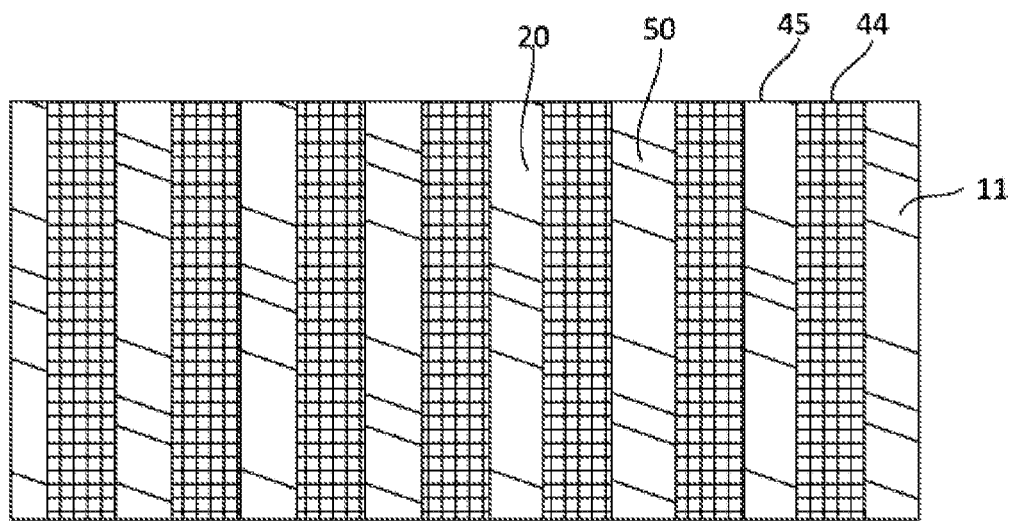
FIG. 10B is a second schematic diagram of a structure of a semiconductor structure during a manufacturing method according to some embodiments.
Figure 10C:
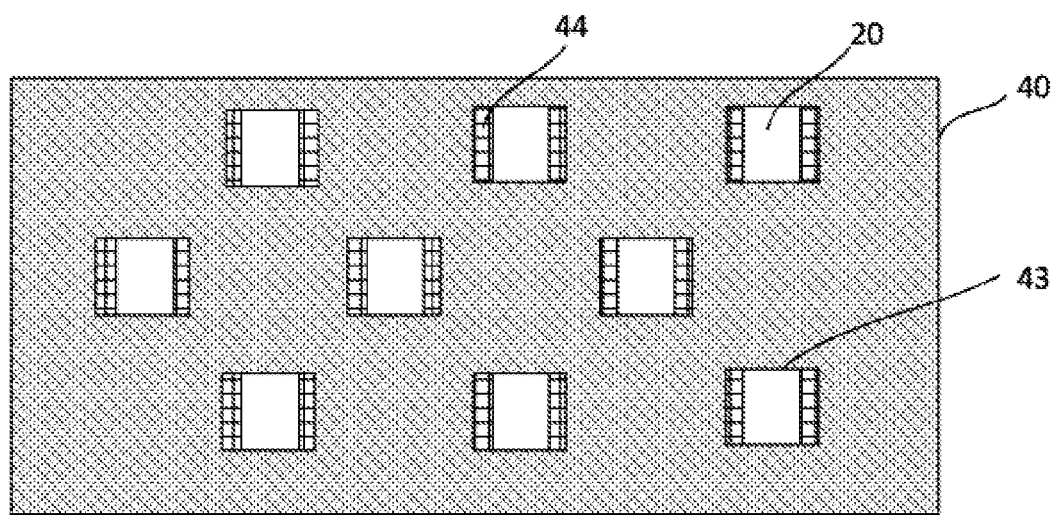
FIG. 10C is a third schematic diagram of a structure of a semiconductor structure during a manufacturing method according to some embodiments.

In an example, as shown in FIG. 10A to FIG. 10C, before forming the first photoresist layer 40 on the substrate 10, the manufacturing method further includes the following operations. A word line mask layer 44 with a word line mask opening 45 is formed on the substrate 10. And, a first photoresist layer 40 is formed on the word line mask layer 44. The first photoresist layer 40 has a photoresist opening 43. Specifically, the plurality of photoresist openings 43 are distributed in a dislocation array, and the photoresist openings 43 are located above the first isolation structure 20.

In an example, the word line mask opening 45 has a first size perpendicular to an extension direction of the word line mask opening 45, while the photoresist opening 43 has a second size perpendicular to the extension direction of the word line mask opening 45, and the second size is greater than the first size. The word line mask layer 44 may be used to ensure that the isolation structure can be etched downward only at the part of the photoresist opening 43 intersected with the word line mask opening 45. Therefore, the size of the first groove 231 formed in the isolation structure is not too large to directly contact with the adjacent active regions to cause defects.

In an example, the formation of the first groove 231 and the second groove 232 on the isolation structure includes the following operations. The isolation structure is etched by using the photoresist opening 43 of the first photoresist layer 40 and the word line mask layer 44 to form a groove 41. And, the isolation structure is etched by using the word line mask opening 45 to form the first groove 231 and the second groove 232.

Figure 11:
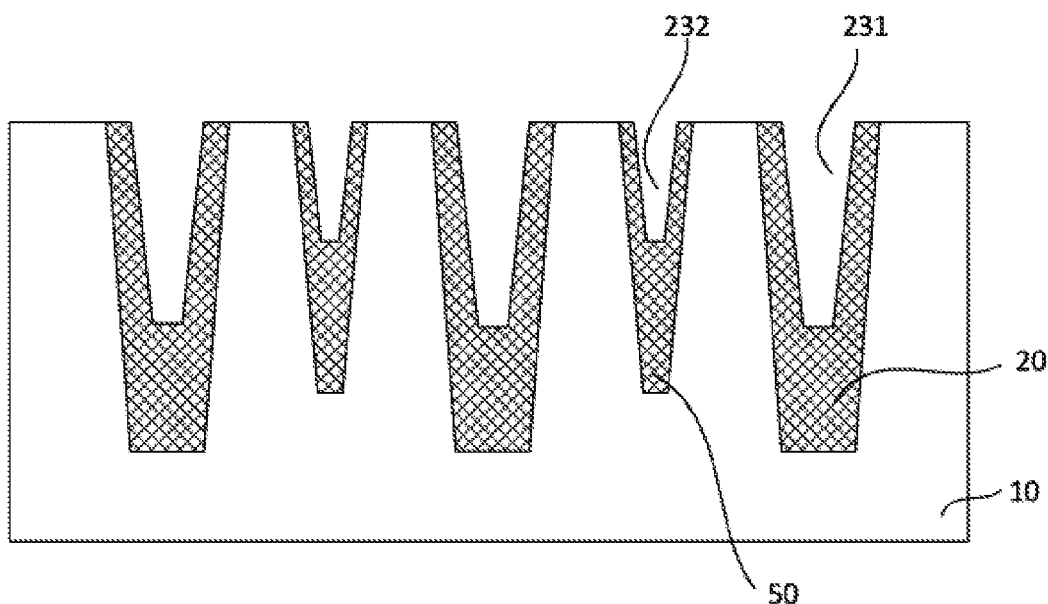
FIG. 11 schematically illustrates a structure of a semiconductor structure with a first groove and a second groove formed by a method according to some embodiments.

As shown in FIG. 10A, a substrate having an isolation structure and a plurality of active regions 11 is provided. The isolation structure is provided among the plurality of active regions 11. In FIG. 10B, a word line mask layer 44 with a word line mask opening 45 is formed. As shown in FIG. 10C to FIG. 11, a first photoresist layer 40 is formed on the word line mask layer 44. In this case, the first photoresist layer 40 has a photoresist opening 43. Due to the word line mask layer 44, after the first photoresist layer 40 is formed, the isolation structure may be pre-etched at the position thereof corresponding to the photoresist opening 43 to form a groove 41. Then, the isolation structure is etched by using the word mask layer 44 to form the first groove 231 and the second groove 232. The word line mask layer 44 not only can prevent the photoresist opening 43 from being too large to cause the groove 41 formed in the isolation structure to directly contact with the adjacent active regions, but also can act as the etching mask for the isolation structure and the active regions 11, which can simplify producing process, and reduce the cost.

The semiconductor structure formed by the method has a longer first convex portion, which may increase the control ability of the word line to the transistor channel, and reduce the leakage current problem of the semiconductor structure. Therefore, the performance of the semiconductor structure can be improved, and thus it is suitable for DRAM devices with small size and high performance.

After considering the specification and implementing the disclosure disclosed here, other implementation solutions of the disclosure would readily be conceivable to those skilled in the art. The disclosure is intended to cover any variations, uses, or adaptations of the disclosure following the general principles thereof and including such departures from the disclosure as come within known or customary practice in the art. The specification and exemplary embodiments are only exemplified. The true scope and spirit of the disclosure shall be subjected to the appended claims.

It should be understood that the disclosure is not limited to the exact construction that has been described above and illustrated in the accompanying drawings. In addition, various modifications and changes can be made without departing from the scope of this disclosure. The protection scope of the disclosure is only limited to the appended claims.

What is claimed is:

1. A semiconductor structure, comprising:
a substrate with a first surface;
active regions with long sides and short sides formed in the substrate, the long sides and the short sides along the first surface;
an isolation structure formed in the substrate and isolating the active regions; and
a word line formed in the substrate and crossing the long sides of active regions and passing the short sides of other active regions, comprising a first convex portion and a second convex portion, wherein the first convex portion are located in the isolation between the passed short sides of other active regions and the second convex portion are located in the isolation structure between the crossed long sides of active regions, and a depth of the first convex portion is greater than a depth of the second convex portion.

2. The semiconductor structure of claim 1, wherein the word line further comprises:
a main body portion, connected with the first convex portion and the second convex portion.

3. The semiconductor structure of claim 2, wherein a plurality of first convex portions and a plurality of second convex portions are provided, and the plurality of first convex portions and the plurality of second convex portions are disposed at intervals.

4. The semiconductor structure of claim 2, wherein the isolation structure comprises a first isolation structure and a second isolation structure; the first convex portion is located in the first isolation structure, the second convex portion is located in the second isolation structure, and a bottom of the first isolation structure is at lower lever than a bottom of the second isolation structure.

5. The semiconductor structure of claim 4,
wherein the main body portion is intersected with the active regions.

6. The semiconductor structure of claim 5, wherein the active regions are arranged in a plurality of rows,
wherein the first isolation structure is located between the short sides of two adjacent active regions, and the second isolation structure is located between the long sides of two adjacent active regions.

7. The semiconductor structure of claim 1, wherein a ratio between the depth of the first convex portion and the depth of the second convex portion is greater than 1.05.

8. The semiconductor structure of claim 1, wherein the depth of the first convex portion is greater than 30 nm.

9. The semiconductor structure of claim 1, wherein a length of the first convex portion along a direction perpendicular to an extension direction of the word line is greater than a length of the second convex portion along the direction perpendicular to the extension direction of the word line.

10. A semiconductor structure, comprising:
a substrate;
an isolation structure formed in the substrate; and
a word line comprising a first convex portion and a second convex portion, wherein the first convex portion and the second convex portion are located in the isolation structure, and a depth of the first convex portion is greater than a depth of the second convex portion;
wherein the first convex portion comprises:
a lower convex portion having a side wall with a first slope; and
an upper convex portion having a side wall with a second slope;
wherein the first slope is different from the second slope.

11. The semiconductor structure of claim 10, wherein a side wall of the second convex portion has a third slope and the first slope is equal to the third slope.

12. The semiconductor structure of claim 10, wherein the upper convex portion has a section of a circular shape or an elliptical shape along a direction of a surface of the substrate, and the lower convex portion has a section of a strip shape along the direction of the surface of the substrate.

13. The semiconductor structure of claim 12, wherein the strip shape comprises two parallel line segments and two arc line segments connecting ends of the two parallel line segments.

14. A method for manufacturing a semiconductor structure, comprising:
providing a substrate having an isolation structure and a plurality of active regions, the isolation structure being disposed among the plurality of active regions;
forming a first groove and a second groove at intervals on the isolation structure, wherein a depth of the first groove is greater than a depth of the second groove; and
forming a word line in the substrate, wherein the word line comprises a main body portion, a first convex portion and a second convex portion, and the first convex portion and the second convex portion are respectively disposed in the first groove and the second groove;
wherein the formation of the first groove and the second groove at intervals on the isolation structure comprises:
forming a groove on the isolation structure, wherein the groove is located between ends of two adjacent active regions; and
forming the first groove and the second groove on the isolation structure having the groove, wherein the first groove is formed at a position where the groove is located;
wherein the formation of the groove on the isolation structure comprises:
forming a first photoresist layer with a photoresist opening on the substrate, wherein the photoresist opening is located between the ends of two adjacent active regions; and
etching the isolation structure by using the photoresist opening to form the groove.

15. The method for manufacturing the semiconductor structure of claim 14, further comprising: before forming the first photoresist layer on the substrate,
forming a word line mask layer with a word line mask opening on the substrate; and
forming the first photoresist layer on the word line mask layer.

16. The method for manufacturing the semiconductor structure of claim 15, wherein the word line mask opening has a first size along a direction perpendicular to an extension direction of the word line mask opening, the photoresist opening on the first photoresist layer has a second size along the direction perpendicular to the extension direction of the word line mask opening, and the second size is greater than the first size.

17. The method for manufacturing the semiconductor structure of claim 15, wherein the formation of the first groove and the second groove at intervals on the isolation structure comprises:
   etching the isolation structure by using the photoresist opening on the first photoresist layer and the word line mask layer to form the groove; and
   etching the isolation structure by using the word line mask opening to form the first groove and the second groove.

* * * * *